United States Patent [19]

Thrower et al.

[11] Patent Number: 5,151,622

[45] Date of Patent: Sep. 29, 1992

[54] CMOS LOGIC CIRCUIT WITH OUTPUT COUPLED TO MULTIPLE FEEDBACK PATHS AND ASSOCIATED METHOD

[75] Inventors: Craig S. Thrower, San Jose; King C. Wang, El Monte, both of Calif.

[73] Assignee: Vitelic Corporation, San Jose, Calif.

[21] Appl. No.: 609,836

[22] Filed: Nov. 6, 1990

[51] Int. Cl.[5] .............. H03K 19/017; H03K 19/0175
[52] U.S. Cl. ................................. 307/475; 307/448; 307/451; 307/574
[58] Field of Search ............ 307/475, 451, 448, 592, 307/594

[56] References Cited

U.S. PATENT DOCUMENTS

| | | | |
|---|---|---|---|
| 4,593,212 | 6/1986 | Svager | 307/475 |
| 4,612,461 | 9/1986 | Sood | 307/475 |
| 4,672,243 | 6/1987 | Kirsch | 307/475 |
| 4,698,526 | 10/1987 | Allan | 307/475 |
| 4,829,203 | 5/1989 | Ashmore, Jr. | 307/451 |

Primary Examiner—David Hudspeth
Assistant Examiner—Andrew Sanders
Attorney, Agent, or Firm—Flehr, Hohbach, Test, Albritton & Herbert

[57] ABSTRACT

A TTL to CMOS input buffer circuit is provided which includes a level shifting circuit including an input terminal and an output node for receiving at the input terminal an input signal at a TTL logic voltage level and for providing at the output node an output signal at a CMOS logic voltage level, the output signal being a logically inverted version of the input signal; and a first circuit for speeding a transition of the output signal from a low CMOS voltage level to a high CMOS voltage level; and a second circuit for preventing the first circuit from interfering with a transition of the output signal from the high CMOS voltage level to the low CMOS voltage level.

25 Claims, 3 Drawing Sheets

CMOS LOGIC CIRCUIT WITH OUTPUT COUPLED TO MULTIPLE FEEDBACK PATHS AND ASSOCIATED METHOD

BACKGROUND OF THE INVENTION

1. Field of the Invention

The invention relates generally to electronic circuits and more particularly to CMOS logic circuits in which an output is coupled to a feedback path to speed logic state transitions.

2. Description of the Related Art

Referring to the illustrative drawings of FIG. 1 there is shown an earlier TTL to CMOS input buffer logic circuit 10. The circuit includes an input terminal 12 and an internal output node 14. A CMOS inverter circuit 16 which includes a PMOS transistor 18 and an NMOS transistor 22 receives respective input signals at TTL logic levels at the input terminal 12 and provides logically inverted versions of the respectively received signals at CMOS logic levels at the output node 14.

The threshold voltage of the CMOS inverter circuit 16 is adjusted so that the circuit will respond to input signals applied to the input node 12 at TTL logic levels. In the case of the inverter circuit 16 shown in FIG. 1, such threshold voltage shifting is accomplished, at least in part, by the use of PMOS transistor 20 which serves as a current source. Alternatively, threshold voltage shifting could be accomplished by adjusting the gate width of PMOS transistor 18, for example.

One problem commonly experienced by prior CMOS logic circuits such as CMOS inverter circuits of the type in which the threshold voltage is shifted to accommodate TTL logic levels has been a timing skew between the length of time required for a low to high input signal transition to propagate a change in the output voltage at node 14 and the length of time required for a high to low input signal transition to propagate a change in the output voltage. In particular, the high to low transitions often are propagated more slowly, at least in part, due to the relatively weak PMOS pull-up used to achieve the desired TTL threshold voltage level.

An earlier solution to this problem of timing skew has been to actively pull-up the voltage at the output node 14. PMOS transistor 24, for example, serves as a pull-up for the internal output node 14 in the course of respective high to low transitions of the input signal provided to terminal 12. By pulling up the output node voltage, the PMOS transistor 24 speeds the transition of the output signal from low to high voltage levels in response to transitions of the input signal from high to low voltage levels. It will be understood, of course, that the output signal at node 14 is an inverted version of the input signal provided at input terminal 12.

Therefore, in earlier CMOS logic circuits such as TTL to CMOS input buffers, an active pull-up device has been used to reduce the timing skew between high to low and low to high transitions. During high to low input signal transitions of the exemplary earlier buffer circuit 10 of FIG. 1, for example, feedback inverter 26 rapidly senses the transitioning of the output signal at node 14 from low to high voltage levels, and in response, provides via feedback path 28 a low logic level signal to the gate of PMOS transistor 24 which causes that transistor to turn on. The turning on of transistor 24, in turn, tends to pull-up the voltage level of the output node 14.

While earlier TTL to CMOS buffer circuits of the type described above generally have been acceptable, there have been shortcomings with their use. More specifically, in the course of input signal transitions from low to high voltage levels, the NMOS transistor 22 is turned on, and the output signal at the output node 14 undergoes a transition from a high to a low voltage level. Unfortunately, during such transitions there is a time interval during which both the NMOS transistor 22 and the PMOS pull-up transistor 24 simultaneously are turned on. During such intervals, the NMOS transistor 22 operates in opposition to the PMOS transistor 24. Such simultaneous activation of these two transistors can lead to an increase in the threshold voltage required to overcome the effects of the pull-up by transistor 24. Furthermore, such simultaneous activation can lead to an increase in the time required for an input signal transition from a low to a high level to propagate a change in the logic level of the output signal.

Thus, there has been a need for a logic circuit in which the timing skew between high to low and low to high input signal transitions can be reduced while maintaining the desired TTL input threshold for the input signal and without resulting in an increase in the time required to propagate low to high input signal transitions. The present invention meets these needs.

SUMMARY OF THE INVENTION

In one aspect, the present invention provides a novel TTL to CMOS input buffer circuit. The novel circuit includes a CMOS inverter in which the threshold voltage has been shifted to accommodate TTL logic input signals. The CMOS inverter includes an input terminal for receiving TTL voltage level input signals and an output node for providing CMOS voltage level output signals. The input buffer also includes first circuitry for speeding transitions of the output signal from low to high CMOS voltage levels. Additionally, the buffer circuit includes second circuitry for preventing the first circuitry from interfering with transitions of the output signal from high to low CMOS voltage levels.

In another aspect, the present invention provides a CMOS logic circuit in which a common output node is coupled to multiple input transistors, each of which includes its own input terminal. At least one load transistor includes a terminal coupled to a voltage supply. The load transistor also serves to pull-up voltage at the common output node. At least one load transistor includes a terminal coupled to the common output node. An output signal, responsive to the combination of input signals provided to the respective input terminals, is provided at the common output node. First feedback circuitry speeds transitions of the output signal from low to high CMOS voltage levels. Second feedback circuitry prevents the first circuitry from interfering with transitions of the output signal from high to low CMOS voltage levels.

In still another aspect, the invention provides a novel method for transitioning the voltage levels of CMOS logic signals. The method involves the step of providing an output signal at a CMOS voltage level at an output node of a circuit. In the course of each transitioning of the output signal from a low CMOS voltage level to a high CMOS voltage level, the voltage level of the output signal is pulled up using a transistor. Conversely, in the course of each transitioning of an output signal from a high CMOS voltage level to a low CMOS voltage level, the transistor is substantially prevented from pulling up the voltage level of the output node.

Thus, the input buffer and the associated method of the present invention advantageously reduces time skew without resulting in the requirement of an increased threshold voltage and without slowing the propagation of low to high input signal transitions.

These and other features and advantages of the present invention will become apparent from the following description of an exemplary embodiment thereof, as illustrated in the accompanying drawings.

BRIEF DESCRIPTION OF THE DRAWINGS

The purpose and advantage of the present invention will be apparent to those skilled in the art from the following detailed description in conjunction with the appended drawings in which.

DESCRIPTION OF THE PREFERRED EMBODIMENT

The present invention comprises a novel CMOS logic circuit and an associated method. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the invention is not intended to be limited to the embodiment shown, but is to be accorded the widest scope consistent with the principles and features disclosed herein.

Figure 1:
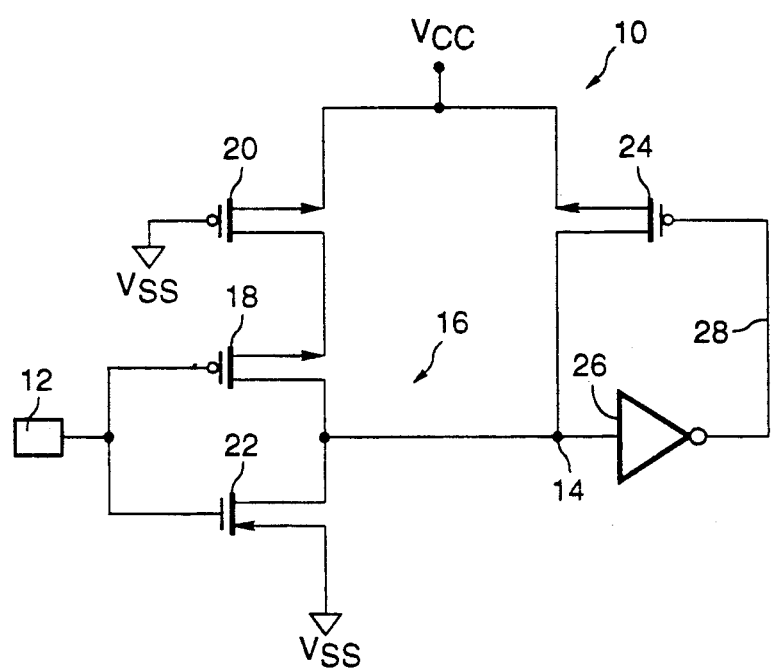
FIG. 1 is an illustrative schematic diagram of an earlier input buffer.
Figure 2:
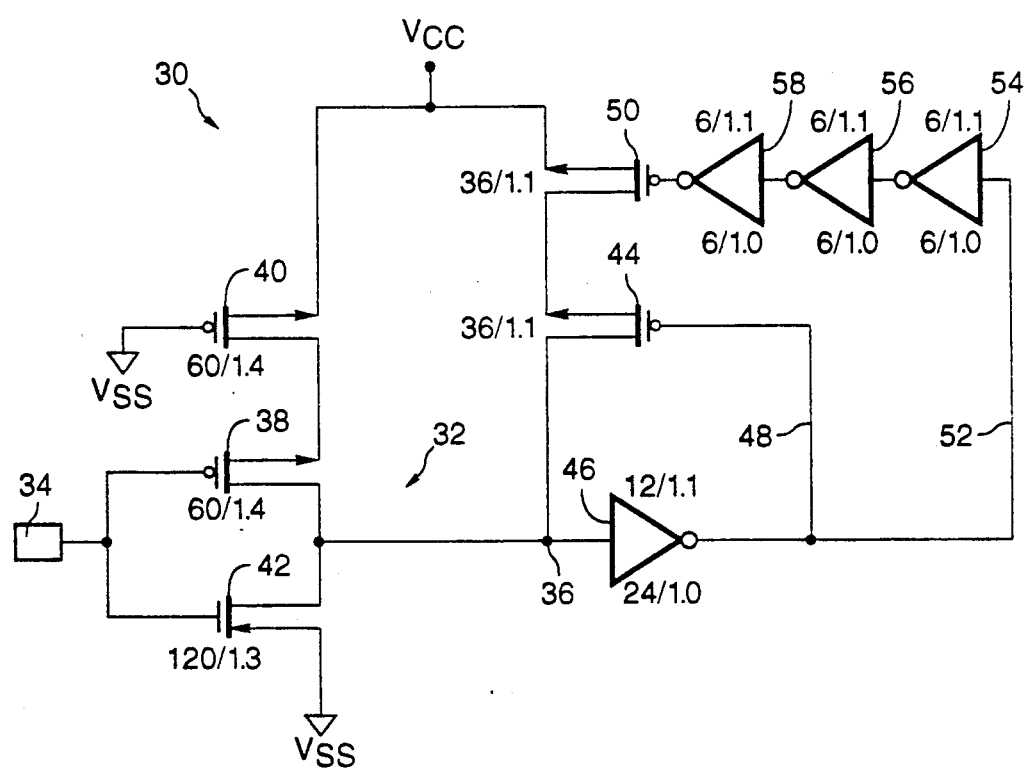
FIG. 2 is an illustrative schematic diagram of an input buffer in accordance with the present invention.

Referring to the illustrative drawings of FIG. 2 there is shown a presently preferred embodiment of a TTL to CMOS input buffer 30 in accordance with the present invention. The input buffer 30 includes a CMOS inverter circuit 32 which has an input terminal 34 and an internal output node 36. The input inverter 32 includes a PMOS transistor 38 and an NMOS transistor 42 which are coupled as shown.

In the presently preferred embodiment, CMOS logic high voltage level is approximately 5.0 volts, and CMOS logic low voltage level is approximately 0.0 volts. The CMOS threshold voltage is approximately 2.5 volts for $V_{CC}=5.0$ volts. In the present embodiment, ground potential, $V_{SS}$ is approximately 0.0 volts. In order to accommodate TTL voltage levels, the threshold voltage of CMOS inverter circuit 32 has been reduced to approximately 1.5 volts. The TTL logic high voltage level is approximately 2.2 volts, and the TTL logic low voltage level is approximately 0.8 volts. It will be understood, of course, that the voltage levels and threshold voltages described can vary depending upon the implementation of the invention.

PMOS transistor 40 serves as a current source which helps to reduce the threshold voltage of the inverter circuit 32 from CMOS voltage levels to TTL voltage levels. The channel sizes of the transistors 38, 40 and 42 are selected so as to further facilitate the achievement of the desired threshold voltage level. It will be understood from the drawings of FIG. 2, that the gate widths of PMOS transistors 38, 40 are approximately 60 microns, and the gate lengths are approximately 1.4 microns. The gate width of the NMOS transistor 42 is approximately 120 microns, and the gate length is approximately 1.3 microns. These gate sizes can be changed depending upon the CMOS process used to produce the input buffer 30, the desired threshold voltage level, and the required output load the input buffer must drive. Furthermore, instead of using PMOS current source transistor 40 to reduce the threshold voltage, the gate width to length ratio (W/L) of PMOS transistor 38, could have been reduced.

The input buffer 30 also includes a first pull-up PMOS transistor 44 having source and drain terminals coupled between the drain node of PMOS transistor 50 and the output node 36. A first feedback path 48 includes a first feedback inverter 46 which receives as its input the output signal provided at node 36, and which provides a first logical control signal to the gate of the first pull-up transistor 44.

A second pull-up PMOS transistor 50 has source and drain terminals coupled between supply voltage $V_{CC}$ and the source node of PMOS transistor 44. The first feedback inverter 46, in addition to serving as a part of the first feedback path 48, also serves as part of a second feedback path 52. The second feedback path 52, in addition to the first feedback inverter 46, also includes a chain of three inverter circuits 54, 56, 58 which are coupled as shown and which provide a second logical control signal to a gate terminal of the second pull-up transistor 50.

The channel width to length ratios of the first feedback inverter 46 are selected such that it has a relatively low threshold voltage and transitions relatively quickly in response to low to high level changes in the level of the output signal at output node 36. In contrast, the channel width to length ratios of the three inverters in the chain of inverters 54, 56 and 58 are selected such that there is a significant delay between the time when the output signal level at node 36 begins to transition and the time when a corresponding change in the voltage level applied to the gate of the second pull-up transistor 50 occurs. In the preferred embodiment, this delay is approximately 4 nanoseconds. This delay interval is discussed more fully below.

During time periods when the input signal applied to input terminal 34 is in a static state, the logical signals applied to the respective gates of the first and second PMOS pull-up transistors 44 and 50, respectively are in opposite logic states. This, of course, is due to the fact that the first feedback path 48 includes only the first feedback inverter 46; while the second feedback path 52 includes the first feedback inverter 46 as well as the chain of three inverters 54, 56 and 58.

Consequently, during such static intervals, only one of the two pull-up transistors 44 or 50 will be turned on. The other will be turned off. This fact is illustrated by the following table:

| Static Levels State Table | | | |
|---|---|---|---|
| Input Signal | Output Signal | Transistor 44 State | Transistor 50 State |
| High | Low | Off | On |
| Low | High | On | Off |

Thus, when the input signal has settled to a static state, there is no active pull-up applied to the output node 36.

Figure 3:
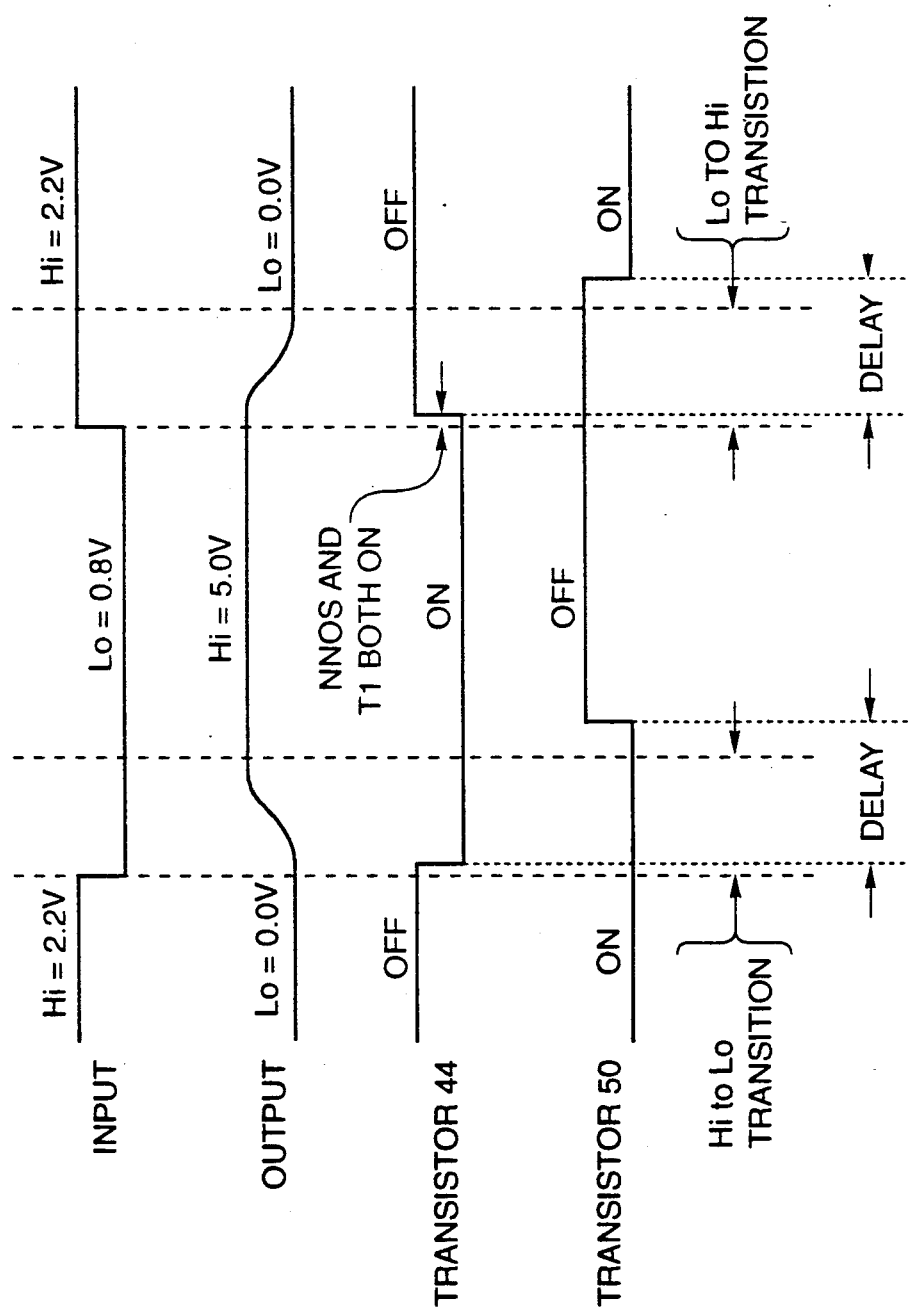
FIG. 3 is a timing diagram for the input buffer of FIG. 2.

The operation of the buffer circuit 30 during time intervals when the output signal at node 36 is in transition now will be described in relation to the illustrative timing diagram of FIG. 3. In response to a transition of the input signal from a high to a low voltage level, the output signal at node 36 transitions from a low to a high voltage level. Before the start of the transition, the first pull-up transistor 44 is turned off, and the second pull-up transistor 50 is turned on. As explained above, the channel width to length ratios of the first feedback inverter 46 are selected such that as the output signal begins to transition from a low voltage level to a high voltage level, the signal applied to the gate of the first pull-up transistor 44 quickly changes from a high level to a low logic level which causes that transistor to turn on. The chain of three inverters 54, 56, and 58 applies to the gate of the second pull-up transistor 50 a high voltage level signal which causes that transistor to turn off. However, as explained above, the channel width to length ratios of the inverters in the chain are selected such that there is a significant delay interval between the time that the first pull-up transistor 44 is turned on and the time at which the second pull-up transistor 50 is turned off.

During this delay interval, both the first and the second pull-up transistors 44 and 50 are turned on. Consequently, an active pull-up is applied to the output node 36 which serves to speed the transition of the output signal from the low to the high voltage level. The delay interval is selected to be long enough such that the transitioning of the output signal from a low voltage level to a high voltage level is facilitated by the active pull-up applied by the first and second pull-up transistors. At the end of the delay interval, the second pull-up transistor is turned off.

In contrast, before a transition of the input signal from a low voltage level to a high voltage level, the first pull-up transistor 44 is turned on, and the second pull-up transistor 50 is turned off. As the output signal begins to transition from high to low voltage levels in response to the transitioning of the input signal from low to high voltage levels, the first pull-up transistor 44 is turned off. However, as indicated in FIG. 3, there may be a brief time interval when both NMOS transistor 42 and the first PMOS pull-up transistor 44 are turned on. During this brief time period when both the NMOS and the first pull-up transistor might be turned on, however, the second pull-up transistor 50 advantageously is turned off. Consequently, the first pull-up transistor 44 is prevented from pulling up the voltage level of output node 36, and interfering with the output node 36 high to low transistion.

It will be appreciated that the first PMOS pull-up transistor 44 is turned off in response to the transition of the output signal from a high to a low logic level. Conversely, after a delay interval introduced by the chain of three inverters 54, 56, and 58, the second pull-up transistor 50 is turned on.

By maintaining the second PMOS transistor 50 in an off state in the course of a transition of the output signal from high to low voltage levels, the first PMOS transistor 44 is prevented from opposing the NMOS transistor 42. As a result, the input buffer 30 does not require the application of a lower threshold voltage to overcome such opposition. Furthermore, as a result of the second transistor being turned off, the turned on first pull-up transistor cannot slow the output signal transition from a high to a low voltage level.

Thus, the TTL to CMOS buffer circuit 30 of the present invention advantageously permits a speed-up of transitions of the output signal from low to high logic levels through the application of an active pull-up by the first and second PMOS pull-up transistors 44 and 50. Conversely, due to the delay interval between the time when the first PMOS pull-up transistor 44 changes state in response to transitions of the output signal and the time when the second PMOS pull-up transistor 50 changes state in response to such transitions, the first PMOS pull-up transistor 44 is prevented from slowing down the transitions of the output signal from high to low logic levels.

While this embodiment of the present invention has been described in detail, it will be appreciated that various modifications can be made to the embodiment without departing from the scope of the invention. For example, the delay interval could be introduced by an RC-type delay line or through the use of one or more CMOS pass gates. Moreover, instead of using PMOS pull-up transistors, NMOS pull-up transistors could have been used. In that case, the logic levels of signals applied to the gates of such NMOS transistors would have to be modified in order to obtain behavior similar to the circuit described herein. Also, instead of employing PMOS transistor 40 as a current source to shift the threshold level of inverter circuit 32, the gate width to length ratio of PMOS transistor 38 could have been reduced to achieve such threshold level shifting.

Thus, the foregoing description is not intended to limit the invention which is defined in the appended claims.

What is claimed is:

1. A TTL to CMOS input buffer circuit comprising:
    level shifting means which includes an input terminal and an output node for receiving at the input terminal an input signal at a TTL logic voltage level and for providing at the output node an output signal at a CMOS logic voltage level, the output signal being a logically inverted version of the input signal;
    first means for speeding a transition of the output signal from a low CMOS voltage level to a high CMOS voltage level; and
    second means, operative throughout a transition of the output signal from the high CMOS voltage level to the low CMOS voltage level, for deactivating said first means when the output signal is static at the high CMOS voltage level and for maintaining said first means in a deactivated state throughout a transition from the high CMOS voltage level to the low CMOS voltage level.

2. The circuit of claim 1 wherein said level shifting means includes:
    a CMOS inverter circuit; and
    a PMOS transistor current source.

3. The circuit of claim 1 wherein the low CMOS voltage level corresponds to a low logic state and the high CMOS voltage level corresponds to a high logic state.

4. The circuit of claim 1 and further including:
    a voltage supply;
    wherein said first means includes a first pull-up transistor coupled between the output node and the voltage supply such that said first transistor can speed a transition of the output signal from the low to the high CMOS voltage level when the first transistor is turned on; and wherein said first means further includes first control means for turning on said first pull-up transistor in the course of a transition of the output signal from the low to the high CMOS voltage level.

5. The circuit of claim 1 and further including:

a voltage supply;

wherein said first means includes a first pull-up transistor and first control means for turning on said first transistor in the course of a transition of the output signal from the low to the high CMOS voltage level;

wherein said second means includes a second pull-up transistor and second control means for maintaining said second transistor turned off in the course of a transition of the output signal from the high to the low CMOS voltage level;

wherein said first pull-up transistor is coupled between said output node and said second transistor; and wherein said second pull-up transistor is coupled between said voltage supply and said first transistor.

6. The circuit of claim 5 wherein said first and second transistors are implemented in PMOS.

7. The circuit of claim 5 wherein said second control means maintains said second transistor turned on in the course of a transition of the output signal from the low CMOS voltage level to the high CMOS voltage level and turns off said second transistor upon substantial completion of a transition of the output signal from the low CMOS voltage level to the high CMOS voltage level.

8. The circuit of claims 5 or 7 wherein said second control means turns on said second transistor upon substantial completion of a transition of the output signal from the high CMOS voltage level to the low CMOS voltage level.

9. A TTL to CMOS input buffer circuit comprising:

a CMOS inverter circuit which includes an input terminal and an output node for receiving at the input terminal an input signal at a TTL logic voltage level and for providing at the output node an output signal at a CMOS logic voltage level, the output signal being a logically inverted version of the input signal;

a voltage supply;

a first pull-up transistor coupled to the output node;

first control means responsive to the output signal for providing a first logical control signal to a gate of the first pull-up transistor;

a second pull-up transistor coupled between the voltage supply and the first pull-up transistor; and second control means responsive to the output signal for providing a second logical control signal to a gate of the second pull-up transistor; and delay means for delaying an occurrence of a change in a logical state of the second control signal relative to an occurrence of a corresponding change in a logical state of the first control signal.

10. The circuit of claim 9 wherein said delay means includes at least one inverter circuit.

11. The circuit of claim 9 wherein said delay means includes at least one pass gate.

12. The circuit of claim 9 wherein said delay means includes at least one RC delay element.

13. The circuit of claim 9 wherein said delay means imparts sufficient delay such that an occurrence of a change in the second logical control signal will not turn on the second pull-up transistor until the output signal has substantially completed a transition from a high CMOS logic voltage level to a low CMOS logic voltage level.

14. The circuit of claim 9 wherein said first pull-up transistor is implemented in PMOS.

15. The circuit of claim 9 wherein said pull-up second transistor is implemented in PMOS.

16. The circuit of claim 9 wherein said first and second transistors are implemented in PMOS.

17. The circuit of claim 9 and further including at least one current source transistor coupled in series with a PMOS transistor of said CMOS inverter circuit.

18. A TTL to CMOS input buffer circuit comprising:

a CMOS inverter circuit which includes an input terminal and an output node for receiving at the input terminal an input signal at a TTL logic voltage level and for providing at the output node an output signal at a CMOS logic voltage level, the output signal being a logically inverted version of the input signal;

a PMOS current source transistor coupled in series with a PMOS transistor of said CMOS inverter circuit;

a voltage supply;

a first PMOS pull-up transistor including a drain coupled to the output node;

first feedback means, responsive to the output signal and including at least one inverter circuit, for providing a first logical control signal to a gate of the first PMOS pull-up transistor;

a second PMOS pull-up transistor including a source coupled to the voltage supply and a drain coupled to a source of the first pull-up transistor; and second feedback means, responsive to the output signal, for providing a second logic control signal to a gate of the second pull-up PMOS transistor and for delaying an occurrence of a change in a logical state of the second control signal relative to an occurrence of a corresponding change in a logical state of the first control signal.

19. A method for shifting signals from TTL logic voltage levels to CMOS logic voltage levels using a CMOS inverter circuit which includes an input terminal and an output node and which includes a voltage supply and a pull-up transistor including source and drain terminals coupled between the voltage supply and the output node, the method comprising the steps of:

receiving a respective input signal at TTL logic voltage levels at the input terminal;

providing a respective output signal at CMOS logic voltage levels at the output node, the respective output signal being a respective logically inverted version of the respective received input signal;

providing the output signal static at a high CMOS voltage level;

deactivating the pull-up transistor while the output signal is static at the high CMOS voltage level;

transitioning the output signal from the static high CMOS voltage level to a low CMOS voltage level and then transitioning the output signal back to the high CMOS voltage level;

in the course of the step of transitioning the output signal from a low CMOS voltage level back to a high CMOS voltage level, pulling up the voltage level of such respective output signal using the pull-up transistor; and maintaining the pull-up transistor in a deactivated state throughout the step of transitioning the output signal from the static high CMOS voltage level to a low CMOS voltage level.

20. The method of claim 19 and further comprising the step of:

turning on the pull-up transistor in the course of output signal transitions from the low CMOS voltage level to the high CMOS voltage level.

21. The method of claims 19 or 20 and further comprising the step of:

turning off the pull-up transistor in the course of output signal transitions from the high CMOS voltage level to the low CMOS voltage level.

22. A method for transitioning CMOS logic level output signals between high and low CMOS voltage levels comprising the steps of:

providing the output signal at a static CMOS high voltage level;

deactivating an output pull-up transistor while the output signal is in the static CMOS high voltage level;

transitioning the output signal from the high CMOS voltage level to a low CMOS voltage level and back to the high CMOS voltage level;

in the course of the step of transitioning the output signal from a low CMOS voltage level to the high CMOS voltage level, pulling up the voltage level of such respective output signal using the output pull-up transistor; and maintaining the pull-up transistor in a deactivated state throughout the step of transitioning the output signal from the static high CMOS voltage level to a low CMOS voltage level.

23. The method of claim 22 and further comprising the step of:

turning on the pull-up transistor in the course of output signal transitions from the low CMOS voltage level to the high CMOS voltage level.

24. The method of claims 22 or 23 and further comprising the steps of:

turning off the pull-up transistor in the course of output signal transitions from the high CMOS voltage level to the low CMOS voltage level.

25. A TTL to CMOS input buffer circuit comprising:

level shifting means which includes an input terminal and an output node for receiving at the input terminal an input signal at a TTL logic voltage level and for providing at the output node an output signal at a CMOS logic voltage level, the output signal being a logically inverted version of the input signal;

first means for speeding a transition of the output signal from a low CMOS voltage level to a high CMOS voltage level; and second means for deactivating said first means when the output signal is static at the high CMOS voltage level and for maintaining said first means in a deactivated state throughout a transition of the output signal from the high CMOS voltage level to the low CMOS voltage level.

* * * * *